US011621246B2

(12) United States Patent
Morein

(10) Patent No.: US 11,621,246 B2
(45) Date of Patent: Apr. 4, 2023

(54) DIFFUSED BITLINE REPLACEMENT IN STACKED WAFER MEMORY

(71) Applicant: ADEIA SEMICONDUCTOR TECHNOLOGIES LLC, San Jose, CA (US)

(72) Inventor: Stephen Morein, San Jose, CA (US)

(73) Assignee: ADEIA SEMICONDUCTOR TECHNOLOGIES LLC, San Jose, CA (US)

(*) Notice: Subject to any disclaimer, the term of this patent is extended or adjusted under 35 U.S.C. 154(b) by 105 days.

(21) Appl. No.: 17/107,710

(22) Filed: Nov. 30, 2020

(65) Prior Publication Data

US 2021/0111161 A1 Apr. 15, 2021

Related U.S. Application Data

(63) Continuation of application No. 16/369,631, filed on Mar. 29, 2019, now Pat. No. 10,854,578.

(51) Int. Cl.
*H01L 29/66* (2006.01)
*H01L 25/065* (2023.01)
(Continued)

(52) U.S. Cl.
CPC .... *H01L 25/0657* (2013.01); *H01L 21/02532* (2013.01); *H01L 21/3212* (2013.01); *H01L 21/7684* (2013.01); *H01L 21/76802* (2013.01); *H01L 21/76877* (2013.01); *H01L 21/823418* (2013.01); *H01L 21/823475* (2013.01); *H01L 21/823481* (2013.01); *H01L 21/823487* (2013.01); *H01L 23/528* (2013.01); *H01L 25/50* (2013.01); *H01L 27/1052* (2013.01);
(Continued)

(58) Field of Classification Search
CPC ............. H01L 25/0657; H01L 21/3212; H01L 21/76802; H01L 21/7684
USPC ......................................................... 257/329
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013-033786 A 2/2013
JP 2018-160519 10/2018
WO WO 2005/043584 A2 5/2005

OTHER PUBLICATIONS

Chung et al., "Novel 4F2 DRAM cell with vertical pillar transistor (VPT)," IEEE, vol. 7, No. 11, Oct. 2011, pp. 211-214.
(Continued)

*Primary Examiner* — Phuc T Dang
(74) *Attorney, Agent, or Firm* — Knobbe, Martens, Olson & Bear LLP

(57) ABSTRACT

Techniques are disclosed herein for creating metal BLs in stacked wafer memory. Using techniques described herein, metal BLs are created on a bottom surface of a wafer. The metal BLs can be created using different processes. In some configurations, a salicide process is utilized. In other configurations, a damascene process is utilized. Using metal reduces the resistance of the BLs as compared to using non-metal diffused BLs. In some configurations, wafers are stacked and bonded together to form three-dimensional memory structures.

20 Claims, 6 Drawing Sheets

300
102
310
BITLINE 130A
305
BITLINE 130B
315
BITLINE 130C
325
312

(51) Int. Cl.

| | |
|---|---|
| ***H01L 29/08*** | (2006.01) |
| ***H01L 23/528*** | (2006.01) |
| ***H01L 29/45*** | (2006.01) |
| ***H01L 21/8234*** | (2006.01) |
| ***H01L 25/00*** | (2006.01) |
| ***H01L 21/02*** | (2006.01) |
| ***H01L 21/768*** | (2006.01) |
| ***H01L 21/321*** | (2006.01) |
| ***H01L 27/105*** | (2023.01) |

(52) U.S. Cl.

CPC .......... *H01L 29/0847* (2013.01); *H01L 29/45* (2013.01); *H01L 29/665* (2013.01); *H01L 2225/06541* (2013.01); *H01L 2225/06565* (2013.01)

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,120,046 | B1 | 10/2006 | Forbes |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,666,256 | B1 * | 5/2017 | Lai ........................ G11C 11/161 |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,115,770 | B2 * | 10/2018 | Sei ........................ H01L 27/249 |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,373,963 | B2 | 6/2022 | DeLaCruz et al. |
| 11,380,597 | B2 | 7/2022 | Katkar et al. |
| 11,385,278 | B2 | 7/2022 | DeLaCruz et al. |
| 11,387,202 | B2 | 7/2022 | Haba et al. |
| 11,387,214 | B2 | 7/2022 | Wang et al. |
| 11,393,779 | B2 | 7/2022 | Gao et al. |
| 11,462,419 | B2 | 10/2022 | Haba |
| 11,476,213 | B2 | 10/2022 | Haba et al. |
| 2004/0084414 | A1 | 5/2004 | Sakai et al. |
| 2006/0057945 | A1 | 3/2006 | Hsu et al. |
| 2007/0111386 | A1 | 5/2007 | Kim et al. |
| 2010/0200948 | A1 | 8/2010 | Kim |
| 2011/0079823 | A1 | 4/2011 | Wu et al. |
| 2012/0188825 | A1 | 7/2012 | Goda |
| 2013/0161730 | A1 | 6/2013 | Pan et al. |
| 2014/0175655 | A1 | 6/2014 | Chen et al. |
| 2015/0064498 | A1 | 3/2015 | Tong |
| 2015/0349056 | A1 | 12/2015 | Jin et al. |

(56) References Cited

U.S. PATENT DOCUMENTS

2016/0343682 A1 11/2016 Kawasaki
2017/0287978 A1 10/2017 Toh et al.
2017/0358598 A1 12/2017 Bedeschi
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2019/0074277 A1 3/2019 Ramaswamy
2019/0115277 A1 4/2019 Yu et al.
2019/0131277 A1 5/2019 Yang et al.
2019/0333550 A1 10/2019 Fisch
2019/0385935 A1 12/2019 Gao et al.
2020/0013765 A1 1/2020 Fountain, Jr. et al.
2020/0035641 A1 1/2020 Fountain, Jr. et al.
2020/0075553 A1 3/2020 DeLaCruz et al.
2020/0294908 A1 9/2020 Haba et al.
2020/0328162 A1 10/2020 Haba et al.
2020/0395321 A1 12/2020 Katkar et al.
2020/0411483 A1 12/2020 Uzoh et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.

OTHER PUBLICATIONS

Ker, Ming-Dou et al., “Fully process-compatible layout design on bond pad to improve wire bond reliability in CMOS lcs,” IEEE Transactions on Components and Packaging Technologies, Jun. 2002, vol. 25, No. 2, pp. 309-316.

Moriceau, H. et al., “Overview of recent direct wafer bonding advances and applications,” Advances in Natural Sciences—Nanoscience and Nanotechnology, 2010, 11 pages.

Nakanishi, H. et al., “Studies on SiO2—SiO2 bonding with hydrofluoric acid. Room temperature and low stress bonding technique for MEMS,” Sensors and Actuators, 2000, vol. 79, pp. 237-244.

Oberhammer, J. et al., “Sealing of adhesive bonded devices on wafer level,” Sensors and Actuators A, 2004, vol. 110, No. 1-3, pp. 407-412, see pp. 407-412, and Figures 1(a)-1(I), 6 pages.

Plobi, A. et al., “Wafer direct bonding: tailoring adhesion between brittle materials,” Materials Science and Engineering Review Journal, 1999, R25, 88 pages.

* cited by examiner

DIFFUSED BITLINE REPLACEMENT IN STACKED WAFER MEMORY

PRIORITY

This application is a continuation of, and claims priority to, U.S. patent application Ser. No. 16/369,631, filed on Mar. 29, 2019, entitled "DIFFUSED BITLINE REPLACEMENT IN STACKED WAFER MEMORY", which is fully incorporated by reference herein.

BACKGROUND

Memory technologies are struggling to keep up with the demands of computing devices. Not only are computing devices becoming smaller, these devices may utilize more bandwidth compared to previous devices. In an attempt to address these demands, different types of memory continue to be developed. Some of these memories include carbon nanotube random access memory (RAM), ferroelectric RAM (FRAM), magnetoresistive RAM (MRAM), phase-change memory (PCM), resistive RAM (ReRAM), and the like.

In some cases, three-dimensional (3D) integration technologies are used with different memory technologies to better utilize space as compared to a single layer of memory. Generally, 3D integration technologies include two or more layers of integrated circuits (ICs) including memory that are stacked vertically, and then connected using through-silicon vias (TSV). This stacking of memory can reduce interconnect wire length, which may result in improved performance and reduced power consumption. To access memory cells, wordlines (WLs) and bitlines (BLs) are utilized. In some memory technologies, BLs are buried within a silicon wafer that are located beneath the transistors and memory cells. Creating buried BLs that meet the performance requirements of some memory technologies can be challenging.

DETAILED DESCRIPTION

Figure 1:
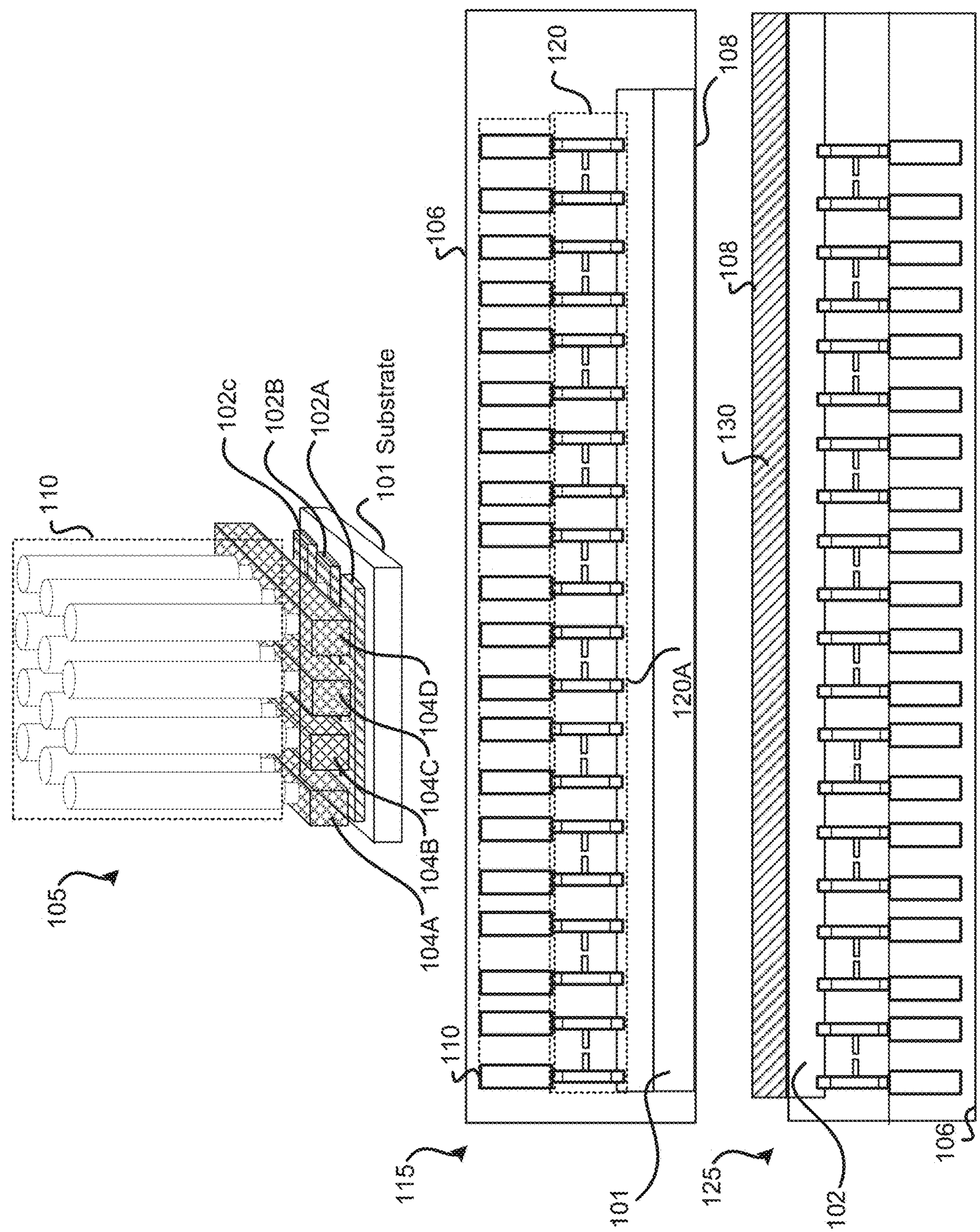
FIG. 1 is a schematic diagram depicting an illustrative memory array that includes metal BLs.

The following detailed description is directed to technologies for creating metal BLs in stacked wafer memory. Using techniques described herein, metal BLs are created on a bottom surface of a wafer. Using metal BLs reduces resistance and can increase performance of memory devices as compared to using non-metal buried BLs. According to examples described herein, wafers can be stacked and bonded together to form three-dimensional memory structures that include metal BLs.

As used herein, the term "wafer" refers to a thin slice of semiconductor material, such as a crystalline silicon, used in electronics for the fabrication of integrated circuits. A wafer serves as a substrate for microelectronic devices built in and over the wafer. In some examples, the wafer is an epitaxial wafer which may have different layers. For instance, the wafer can include different conductivity layers.

According to some configurations, the transistors and memory cell structures for the memory are created within the wafer. In some examples, trenches for defining BLs and WLs can be lithographically patterned and etched into the wafer. Oxide material is deposited to provide isolation between different areas of the wafer, such as the areas between BLs and WLs. Chemical-mechanical polishing (CMP), or some other polishing technique, can be used to remove the excess oxide material. Generally, the BLs are disposed under transistors (e.g., vertical transistors) of a transistor array and can be electrically connected to drain regions of the vertical transistors.

The transistor array is positioned above the BLs and includes an array of transistors, such as vertical pillar transistors, or some other type of transistors. Generally, vertical pillar transistors may be utilized to increase the device density on the wafer as compared to transistors that are not vertical pillar transistors.

The storage elements of memory cells may be positioned above the top of the transistors. The memory cells may include but are not limited to, dynamic RAM (DRAM), ferroelectric RAM (FRAM), magnetoresistive RAM (MRAM), phase-change memory (PCM), resistive RAM (ReRAM), nanotube random access memory (RAM), and the like. For static RAM (SRAM) memories the memory cell may include cross coupled transistors at the same level as other transistors. Generally, any type of memory cell can be utilized. An electrical contact can also be created that couples to one or more of the transistors or some other connector. In some instances, the electrical contact is a metal, such as tungsten.

The metal BLs are created on the bottom surface of the wafer. In some examples, the wafer is flipped over such that the bottom surface of the wafer is on top, and the top surface of the memory cells is on the bottom. Flipping the wafer is performed to make the process of removing a portion of the bottom of the wafer easier as compared to not flipping the wafer. A handle wafer may be attached to the top surface of the substrate to assist with flipping and further processing. After flipping the wafer, the substrate can be removed using a wafer thinning process. For instance, back-grinding, CMP, and/or some other wafer thinning process can performed to expose the diffused BLs. Generally, wafer thinning is the process of removing material from the backside of a wafer to a desired final target thickness. Prior to back-grinding, wafers are typically laminated with UV-curable back-grinding tape, which helps protect the wafer from damage. In some configurations, all or a portion of the diffused BLs may also be removed.

After any back-grinding is performed, one or more processes may be performed to increase the conductivity of the diffused BLs, or the region beneath the transistors forming BLs. For example, additional doping of the diffused BLs can be performed, in-situ doped silicon may be epitaxially grown (e.g., using vapor-phase epitaxy (VPE), chemical vapor deposition (CVD),) . . . ), and/or metal BLs may be created. The metal BLs can be created using different technologies, such as a self-aligned silicide ("salicide") process or a damascene process. The salicide process may include, for example, deposition of a thin transition metal layer over the bottom layer of the wafer. Different metals can be utilized. Some example metals include, but are not limited to titanium, cobalt, nickel, platinum, and tungsten.

The wafer may then be heated (e.g., rapid thermal anneal (RTA), laser spike, etc.) allowing the transition metal to react with the silicon associated with the BLs created earlier to form a low-resistance transition metal silicide. Generally, silicides provide benefits such as being low resistance, being easy to etch, providing good contacts to other materials, and being compatible with different semiconductor processes. Following the reaction of the transition metal with the BL regions of the wafer, any remaining transition metal is cleaned (e.g., by chemical etching).

In other configurations, the metal BLs can be created using a damascene process. According to some examples, a barrier layer may be utilized to protect the other components of the wafer. The barrier layer may be formed on the surfaces of trenches using a process such as a chemical vapor deposition (CVD) process or a physical vapor deposition (PVD) process. In the damascene process, a portion of the BL trenches may be etched where the metal BLs are to be located. Copper, or other electrically conductive metal, is disposed such that the metal overfills the trenches. CMP, or other technique, can be used to remove the metal that extends above the top of the trenches such that the BLs are isolated. The metal that is located within the trenches becomes the metal BLs.

Two or more wafers can be stacked and bonded to create three-dimensional memory structures. Different bonding processes can be utilized. For example, direct or fusion bonding, surface activated bonding, plasma activated bonding, glass frit bonding, adhesive bonding, and the like may be utilized. According to some examples, direct or fusion bonding may be utilized to bond the different layers that define the three-dimensional memory structure. Prior to bonding one or more additional layers may be deposited on the wafer. For example, an oxide layer may be deposited to protect the metal BLs and/or to increase the strength of the bond, depending on the bonding process utilized. In some configurations, a vertical via is etched through the layers and then filled with a conductive material to electronically couple the different layers of the three-dimensional memory structure. In other configurations, the metal BLs on one memory layer can be connected to metal BLs on a different memory layer.

Additional details regarding the various technologies and processes described above will be presented below with regard to FIGS. 1-6.

In the following detailed description, references are made to the accompanying drawings that form a part hereof, and that show, by way of illustration, specific examples. The drawings herein are not drawn to scale. Like numerals represent like elements throughout the several figures (which may be referred to herein as a "FIG." or "FIGS.").

FIG. 1 is a schematic diagram depicting an illustrative memory array that includes metal BLs. As illustrated, FIG. 1 shows a schematic diagram 105 of a memory array, a cross-section 115 of a transistor array and memory cells, and a cross-section 125 that includes metal BLs disposed on a bottom surface of the wafer.

Schematic diagram 105 illustrates a memory array, such as a $4F^2$ memory array that includes vertical transistors, such as a vertical pillar transistor (VPT) coupled to memory cell storage elements 110. As will be appreciated, conventional techniques can be used to create the memory array, such as $4F^2$ memory array. While a $4F^2$ memory array is illustrated, other memory arrays can be utilized. Generally, the memory cells are addressable via the WLs 104, such as WLs 104A-104B), and BLs 102, such as BLs 102A-102C. As illustrated, the channel of a VPT is built on a buried BL 102 and under a memory cell storage element 110. The buried BLs may be created by doping a portion of the substrate 101 and etching through it to isolate the individual BLs, such as BLs 102A, 102B, and 102C. The WLs 104 of the VPT surround the silicon channel and are used to control the gate of the VPT.

Diagram 105 illustrates four WLs 104A-104D, that are positioned above and perpendicular to the BLs 102A-102C such that the WLs 104 and the BLs 102 intersect at each of the memory cells. As illustrated, the BLs 102 are diffused BLs which are positioned above the substrate 101. According to some configurations, the diffused BLs are doped regions of the substrate such that conductivity of the BLs 102 is increased.

Cross-section 115 shows a transistor array and memory cell storage elements built on top of the transistors. Different techniques can be utilized to create the transistors that form the transistor array. The transistors 120 and memory cell storage elements 110 form a plurality of memory cells that form a memory array.

Generally, the memory array includes a plurality of memory cells that are arranged in columns and rows. As can be seen by referring to diagram 105, the different rows are connected to different WLs and the memory cells in different columns are connected to different WLs. The BLs and the WLs are used to address the memory cells. The gates of the transistors 120 in a row are electronically connected to the same WL. The memory cells in different columns are connected to different BLs 102.

According to some configurations, the BLs and WLs may be defined by removing portions of the wafer (e.g., by etching). The BLs and WLs can be created using shallow trench isolation (STI) or other techniques or procedures. Generally, the STI process involves etching a pattern of trenches in the silicon of the wafer, depositing one or more dielectric materials (such as silicon dioxide) to fill the trenches, and removing the excess material using a polishing technique such as CMP, or some other technique.

In some examples, after creating the buried BLs, which may also be referred to herein as "diffused BLs", and the WLs in the silicon, the transistors 120 may be formed. According to some examples, the WLs are etched back to remove a portion of the material from the WLs. The gates of the transistors can then be created. For instance, isotropic sputtering can be used to deposit the gate material. In other examples, such as for a metal-semiconductor field-effect transistor (MESFET) the gate oxide can be grown using a chemical vapor deposition (CVD) process, a thermal oxidation process, or some other process.

After forming the gates, oxide can be deposited to cover the gate material. The excess gate material and oxide can be removed using CMP, or other techniques. The gates of transistors 120A are then split by etching, or other techniques. The memory cell storage elements 110 are then built on a top surface of the transistors. The memory cell storage elements 110 may be built using memory technologies such as, but not limited to SRAM, DRAM, FRAM, MRAM, PCM, ReRAM, nanotube, and the like. Generally, any type of memory cell storage element 110 can be created using the techniques described herein.

Cross-section 125 illustrates metal BLs 130 disposed on a bottom surface of the wafer. In some examples, the wafer is flipped over such that the bottom surface 108 of the wafer is located on top, and the top surface of the memory cell storage elements 110, or a material covering the memory cell storage elements 110 is located on the bottom. After flipping the wafer, the bottom substrate layer 101 of the wafer can be removed. For instance, as briefly discussed above, back-grinding, or other technique, can be performed to remove the substrate 101 and expose the diffused BLs 102. According to some examples, none, a portion, or all of the diffused BLs 102 can be removed by further back-grinding, or some other technique.

After wafer thinning is performed, one or more procedures can be performed. For example, the metal BLs 130 can be created. The metal BLs 130 can be created using different techniques or procedures. For example, metal BLs 130 can be created using a salicide process. The salicide process may include deposition of a thin transition metal layer over the bottom layer of the wafer. The wafer may then be heated (e.g., by a rapid thermal anneal (RTA) process, laser spike process, etc.) allowing the transition metal to react with the silicon to form a low-resistance transition metal silicide. Following the reaction, any remaining transition metal may be cleaned (e.g., by chemical etching).

Two or more wafers can be stacked and bonded to create three-dimensional memory structures. Different bonding processes can be utilized. For example, direct or fusion bonding, surface activated bonding, Plasma activated bonding, Glass frit bonding, adhesive bonding, and the like may be utilized. According to some examples, direct or fusion bonding may be utilized to bond the different layers that define the three-dimensional memory structure. In some configurations, a vertical via is etched through the layers and then filled with a conductive material to electrically couple the different layers. The resistivity of the metal BLs 130 is less compared to non-metal BLs, thereby allowing better performance and less resistance between the different layers of the three-dimensional memory structure as compared to non-metal BLs.

In other configurations, the metal BLs 130 can be created using a damascene process. According to some examples, a barrier layer is utilized to protect the other components of the wafer. In the damascene process, a portion of the BL trenches are etched where the metal BLs are to be located. Copper, or other conductive metal (e.g., tungsten, titanium, aluminum, titanium nitride, tantalum, tantalum nitride, cobalt, nickel, . . . ), is disposed such that the metal overfills the trenches. CMP, or other techniques, can be used to remove the metal that extends above the top of the trenches such that the BLs are electrically isolated. The metal that is located within the trenches becomes the metal BLs. The metal utilized may be a metal or a metal alloy material such as but not limited to copper, tungsten, cobalt, aluminum, or any other suitable metal or metal alloy fill material.

According to some configurations, doping can be performed from the backside of the wafer such that the diffused BLs 102 are more conductive. In yet other configurations, in-situ doped silicon may be epitaxially grown (e.g., using vapor-phase epitaxy (VPE), chemical vapor deposition (CVD), . . . ) on the bottom portion of the diffused BLs 102. Given that the backside is accessible, the source regions (or drain regions) of the transistors may be formed or augmented. In some instances, this may reduce or eliminate certain doping steps from the top side earlier in the process thereby reducing cost and complexity. As discussed above, any combination of these approaches can be performed. More details regarding creating the metal BLs 130 are provided below with reference to FIGS. 2-6.

Figure 2A:
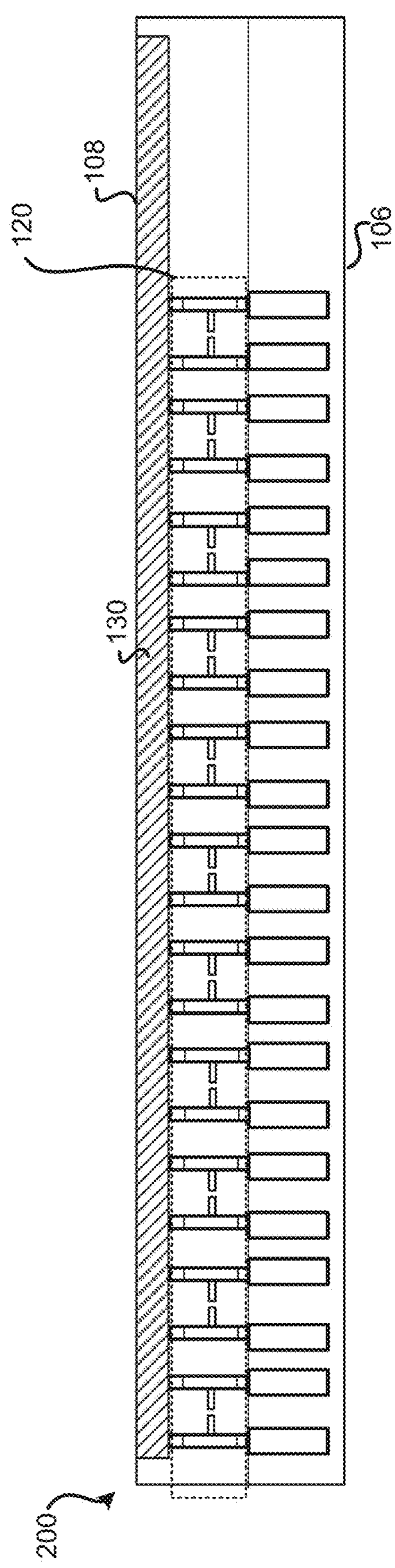
FIG. 2A is a schematic diagram depicting an illustrative memory array that includes a metal BL that is adjacent to transistors.

FIG. 2A is a schematic diagram depicting an illustrative memory array that includes metal BLs that are adjacent to transistors 120 associated with memory cell storage elements 110. As illustrated, wafer 200 shows the BLs 130 located adjacent to a bottom surface of the transistors 120.

As briefly discussed above, the thickness of the wafer is reduced before creating the metal BLs 130. In some configurations, the substrate 101 and other material covering the bottom of the transistors 120 is thinned. According to some examples, the material covering the bottom of the transistors 120 may be removed such that the metal BLs 130 are in direct contact with the bottom surface of the transistors 120. In other cases, substantially all of the material of the wafer covering the bottom of the transistors 120 is removed. For example, a portion of the diffused BLs 102 remain. According to some examples, a timed back-grinding process can be performed. For instance, back-grinding can be performed for a predetermined time such that a desired amount of material is consistently removed from different wafers. According to other examples, CMP process can be performed to remove the material covering the bottom of the transistors 120 and stop at the bottom of dielectrics such as the bottom of shallow trench isolations.

Figure 2B:
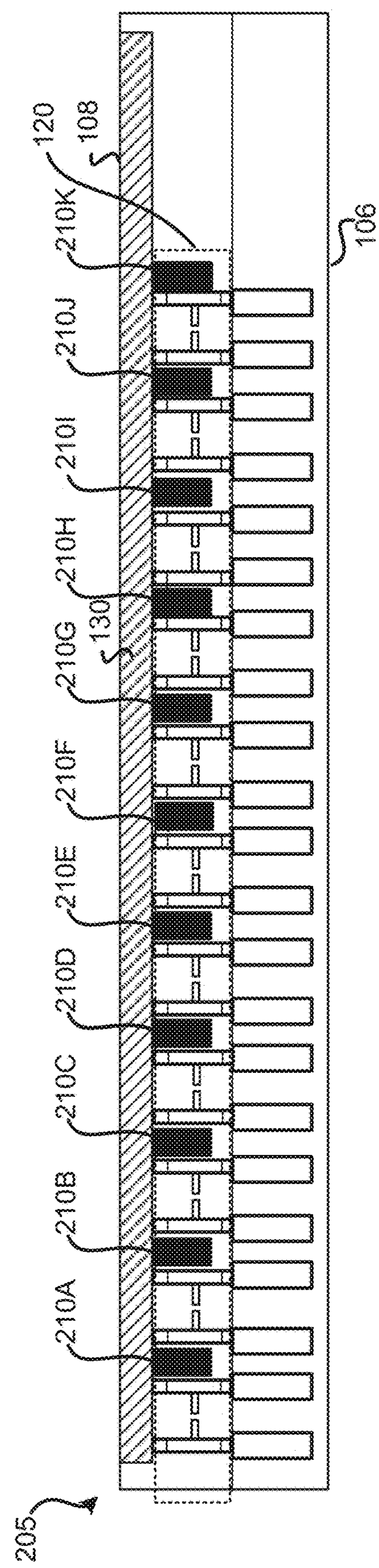
FIG. 2B is a schematic diagram depicting an illustrative memory array that includes metal BLs and isolation areas between adjacent transistors.

FIG. 2B is a schematic diagram depicting an illustrative memory array that includes metal BLs 130 and regions 210 located between adjacent transistors 120 to isolate the transistors. Isolating the transistors 120 can decrease the capacitance and increase the electrical resistance such that unwanted electrical flow of charge carriers is diminished.

In some examples, regions between adjacent areas may be isolated by depositing a material that has different electrical properties from the material comprising the transistors. According to some examples, the material deposited within the isolation regions 210 is a low-k dielectric material. A low-k dielectric has a small relative dielectric constant relative to silicon dioxide. Generally, replacing the silicon dioxide with a low-k dielectric reduces parasitic capacitance. As illustrated, the isolation regions include 210A, 210B, 210C, 210D, 210E, 210F, 210G, 210H, 210I, 210J, and 210K.

Figure 3:
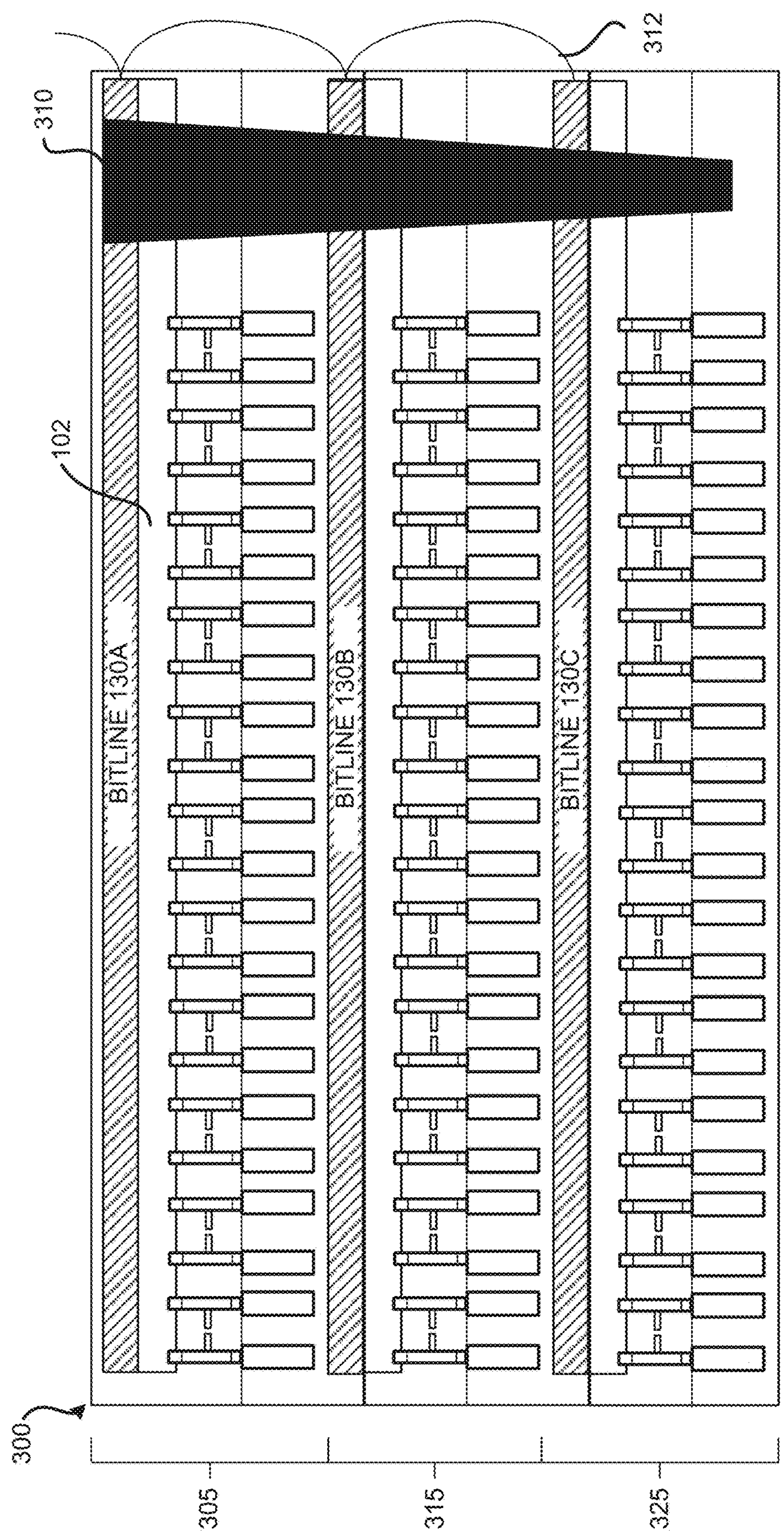
FIG. 3 is a schematic diagram depicting an illustrative three-dimensional memory array that includes metal BLs.

FIG. 3 is a schematic diagram depicting an illustrative three-dimensional memory array that includes metal BLs 130. As illustrated, 3D memory 300 includes a first memory array 305 stacked on a second memory array 315 that is stacked on a third memory array 325. While three memory arrays are shown stacked in this example, in other examples more or fewer memory arrays may be stacked and/or bonded to create 3D memory.

The memory arrays 305, 315, and 325 can be electronically coupled via the metal BLs 130 by vertically etching an area 310 and filling the area with a conductive material, such as Tungsten, or some other metal or material that is utilized in electrical connections. In other examples, the metal BLs 130 can be wired together as illustrated by indicator 312.

Figure 4:
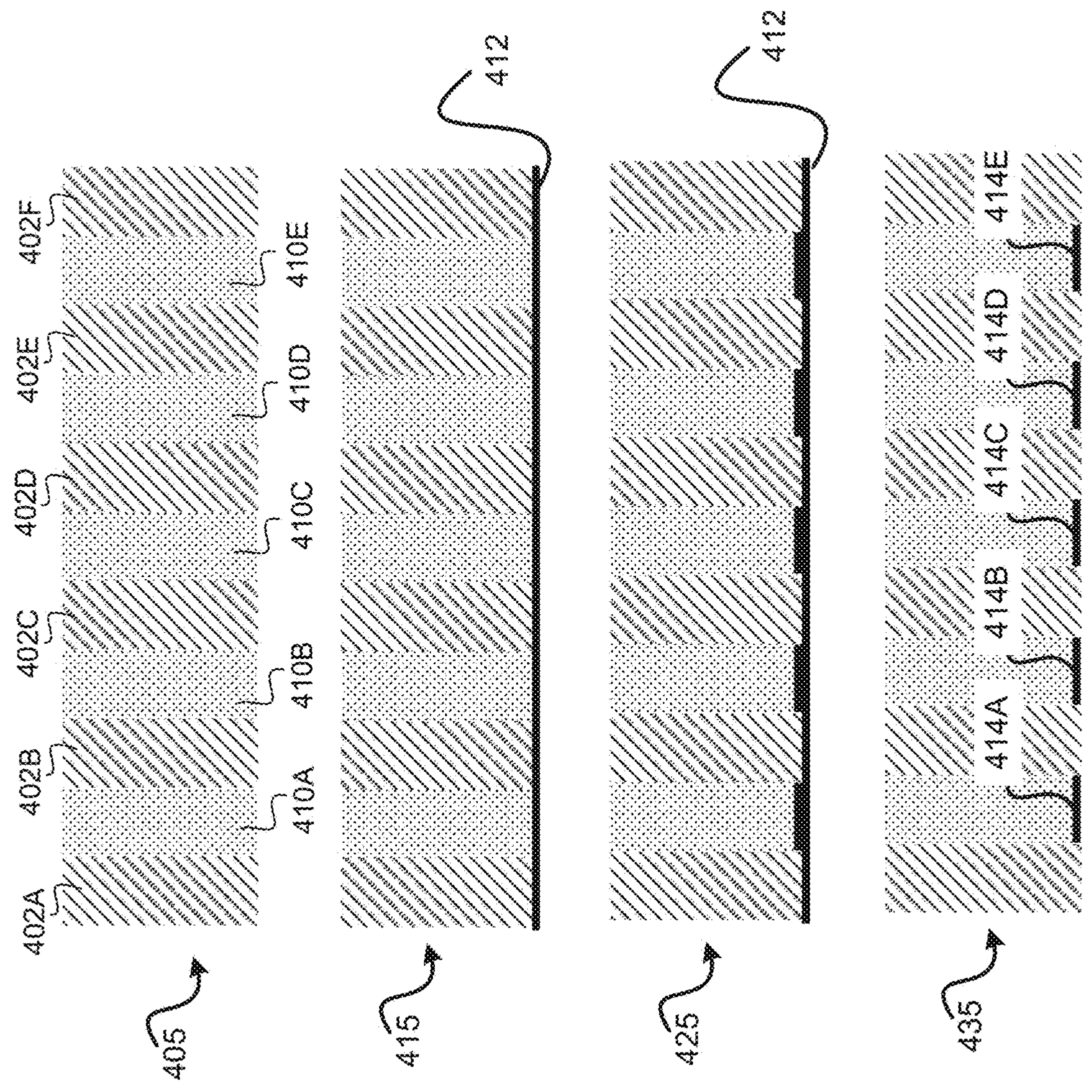
FIG. 4 is a schematic diagram depicting different stages for creating metal BLs in a memory array.

FIG. 4 is a schematic diagram depicting different stages for creating metal BLs in a memory array using a salicide process. As discussed, the metal BLs 130 can be created using different technologies. For example, metal BLs 130 can be created using a salicide process.

As illustrated, FIG. 4 includes a cross-section 405 that shows diffused BLs created during an can stage of the fabrication process. Referring to cross-section 405, a plurality of diffused BLs 410A, 410B, 410C, 410D, and 410E are shown. As discussed above, trenches can be etched into a wafer before forming the transistors 120 or building the memory cells 110. The BLs 410A, 410B, 410C, 410D, and 410E are isolated by regions 402A, 402B, 402C, 402D, 402E, and 402F.

Cross-section 415 illustrates deposition of a metal layer 412 on the bottom of the wafer. As discussed herein, the salicide process can include deposition of a thin transition metal layer over all or a portion of the bottom layer of the wafer.

Cross-section 425 illustrates the wafer after applying heat to the wafer. For example, the wafer can be heated using rapid thermal anneal (RTA), laser spikes, or the like. The heating of the wafer allows the metal layer 412 to react with the silicon of the wafer to form a low-resistance transition metal silicide. In the illustrated examples, the transition metal does not react with regions 402A, 402B, 402C, 402D, 402E, and 402F of the wafer but does react with the diffused BLs 410A, 410B, 410C, 410D, and 410E.

Referring to cross-section view 425 it can be seen that a portion of the metal layer has interacted with the BLs 410A, 410B, 410C, 410D, and 410E.

Cross-section 435 illustrates the wafer after cleaning. Following the reaction of the metal with the wafer caused by the heating, any remaining transition metal is cleaned (e.g., by CMP). Metal silicide 414A, 414B, 414C, 414D, and 414E is shown covering BLs 410A, 410B, 410C, 410D, and 410E.

Figure 5:
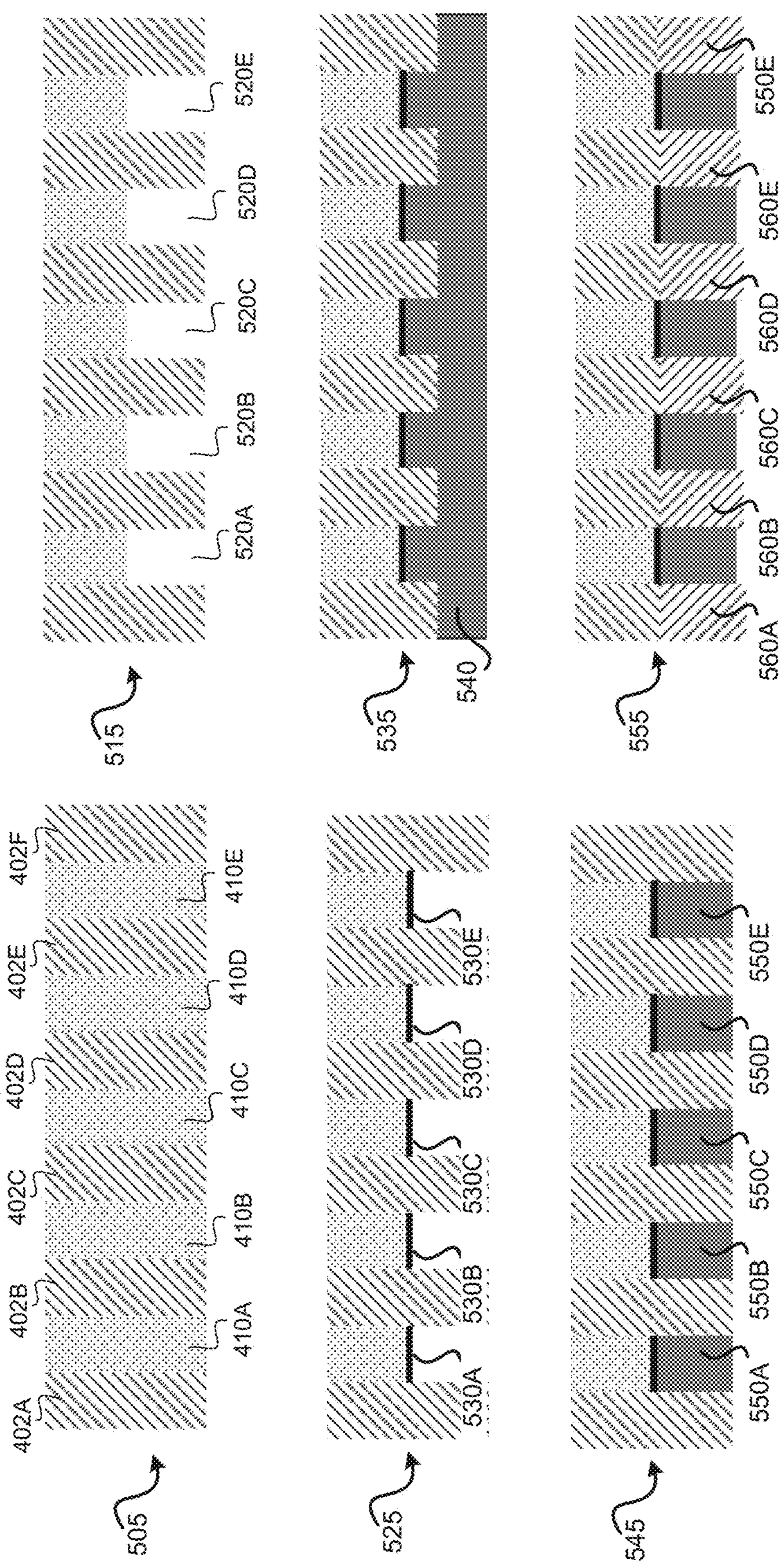
FIG. 5 is a schematic diagram depicting different stages for creating metal BLs using a damascene process in a memory array.

FIG. 5 is a schematic diagram depicting different stages for creating metal BLs using a damascene process in a memory array.

As illustrated, FIG. 5 includes a cross-section 505 that shows diffused BLs 130 created during an earlier stage of the fabrication process. Referring to cross-section 505, a plurality of diffused BLs 410A, 410B, 4100, 410D, and 410E are shown. As discussed above, trenches can be etched into a wafer before forming the transistors or building the memory cells. The BLs 410A, 410B, 410C, 410D an 410E are isolated by regions 402A, 402B, 402C, 402D, 402E, and 402F.

Cross-section 515 shows etching a lower portion of the BLs 410A, 410B, 410C, 410D, and 410E. As illustrated, the etching removes regions 520A, 520B, 520C, 520D, and 520E.

According to some configurations, one or more processes may be performed to increase the conductivity of the diffused BLs. For example, additional doping of the diffused BLs can be performed, in-situ doped silicon may be epitaxially grown (e.g., using vapor-phase epitaxy (VPE), chemical vapor deposition (CVD), . . . ), and the like.

Cross-section 525 shows creating a barrier layer (or liner) within the BLs 410A, 410B, 410C, 410D, and 410E before depositing metal using the damascene process. In some configurations, a silicide process is used to create the barrier layer that is between the top of the regions 520A, 520B, 520C, 520D, and 520E and the bottom of the BLs 410A, 410B, 410C, 410D, and 410E as illustrated by elements 530A, 530B, 530C, 530D, and 530E. In other examples, the barrier layer may cover the walls formed between the BLs 410A, 410B, 410C, 410D, and 410E and the regions 402A, 402B, 402C, 402D, 402E, and 402F. In yet other examples, a barrier layer may not be created when creating metal BLs using the process illustrated in FIG. 5.

Cross-section 535 shows an area 540 that is filled with a metal using a damascene process. According to some configurations, copper, tungsten, or other metal or alloy, is disposed within area 540 such that the metal overfills the trenches. In yet other examples, aluminum can be utilized.

Cross-section 545 shows the wafer after cleaning the wafer to remove the excess metal. According to some examples, CMP, or other technique, can be used to remove the metal that extends above the top of the trenches such that the metal BLs are isolated as illustrated by regions 550A, 550B, 550C, 550D, and 550E.

Cross-section 555 shows the wafer after filling regions adjacent to the metal BLs regions with a low-k dielectric. In some examples, at least a portion of the regions 402A, 402B, 402C, 402D, 402E, and 402F are etched. Regions 560A, 560B, 560C, 560D, and 560E are then filled with a low-k dielectric material.

Figure 6:
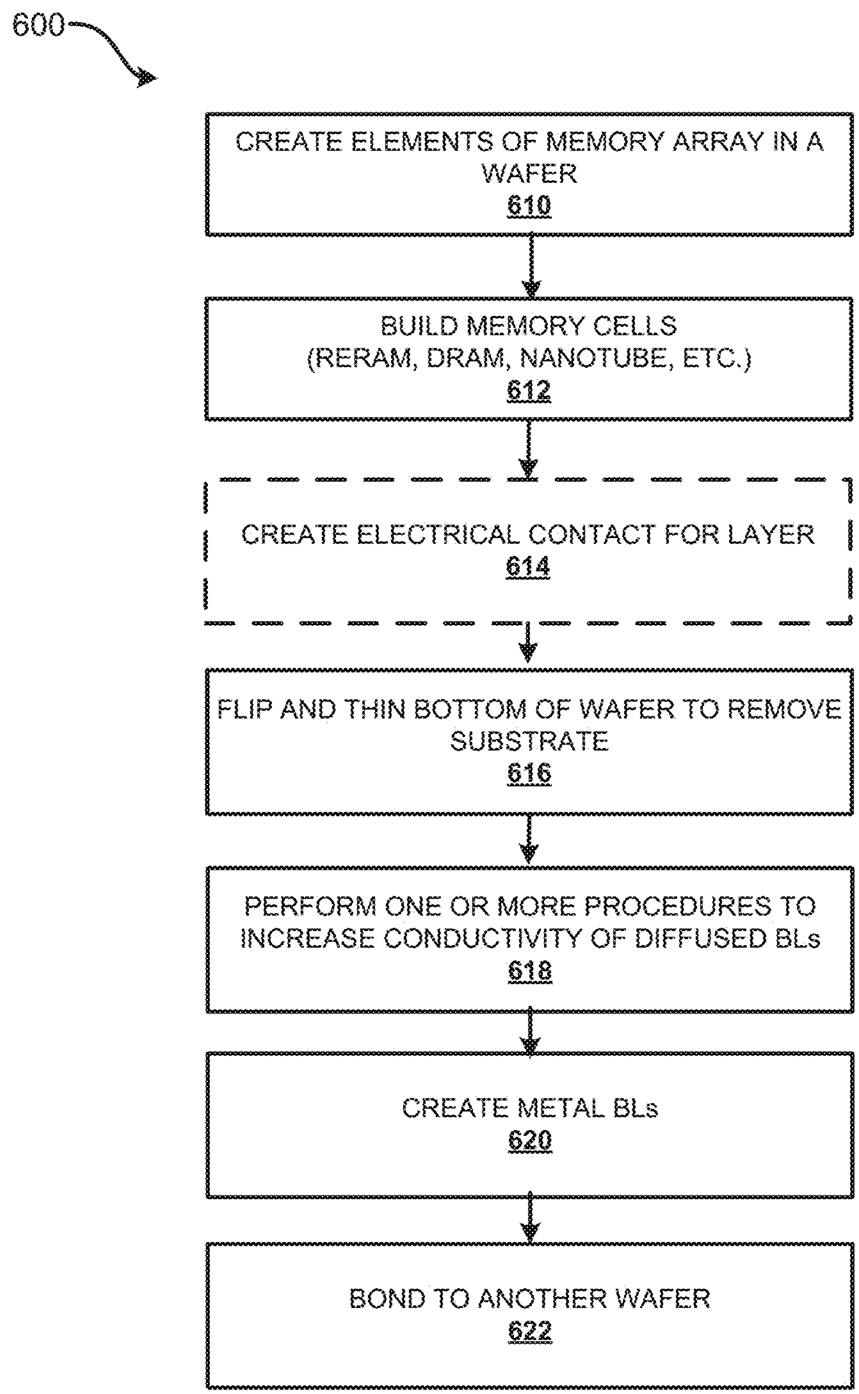
FIG. 6 is a flow diagram illustrating aspects of a mechanism disclosed herein for creating metal BLs in a three-dimensional memory.

FIG. 6 is a flow diagram showing an example process 600 that illustrates aspects of creating metal BLs 130 in a three-dimensional memory in accordance with examples described herein.

The logical operations described herein are referred to variously as operations, structural devices, acts, or modules. These operations, structural devices, acts, and modules may be implemented using different techniques or procedures. It should also be appreciated that more or fewer operations may be performed than shown in the FIGS. and described herein. These operations may also be performed in parallel, or in a different order than those described herein.

The process 600 may include at 610 creating elements of the memory array. As discussed above, the transistors 120, the memory cell storage elements 110 and the diffused BLs 102 and WLs 104 can be created using, for example, shallow trench isolation (STI). STI includes etching the silicon wafer to create trenches that define the BLs and WLs. As also discussed above, different techniques can be utilized depending on the type of transistors being created. The memory cell storage elements 110 may be created using one or more different memory technologies. For example, the memory cells may include but are not limited FRAM, MRAM, PCM, ReRAM, nanotube, DRAM, and the like.

At 612, the memory cells are created. As discussed above, the memory cells may be created using one or more different memory technologies. For example, the memory cells may include but are not limited to SRAM, DRAM, FRAM, MRAM, PCM, ReRAM, nanotube, and the like.

At 614, an electrical contact may be created for the layer. The electrical contact may be a metal, such as but not limited to tungsten, or some other metal. In other examples, the metal BLs 130 may be used to electrically couple the different layers of the memory array.

At 616, the wafer is flipped, and wafer thinning is performed. As discussed above, the wafer is flipped such that the top of the wafer is now the bottom of the wafer, and the bottom of the wafer closest to the bottom surface of the transistors is now the top surface. All or a portion of the material disposed below the bottom surface of the transistors can be back-grinded and/or removed using some other technique or procedure.

At 618, one or more procedures can be performed after thinning the backside of the wafer. As discussed above, additional doping of the diffused BLs can be performed, and/or in-situ doped silicon may be epitaxially grown (e.g., using vapor-phase epitaxy (VPE), chemical vapor deposition (CVD), . . . ).

At 620, the metal BLs are created. As discussed above, the metal BLs are deposited on the bottom side of the wafer. In some examples, the metal BLs 130 are disposed using a salicide process that includes depositing a silicide metal on the bottom of the wafer, performing a heat/anneal process (e.g., using RTA, laser spike), and then removing the portion of the metal such that the BLs are exposed. In other examples, a damascene process can be utilized to create BLs of copper, or some other metal. CMP can be utilized to isolate the metal BLs.

In some examples, a liner, or barrier layer, may be placed before electroplating the metal in the damascene process. For example, a barrier layer can be created that includes a dielectric material, such as a low-K dielectric. A low-K dielectric material is a material having a dielectric constant that is lower than the dielectric constant of silicon dioxide.

At 620, the wafer can be bonded to another wafer. As discussed above, the wafer can be bound using a variety of different bonding techniques. In some examples, to create a memory structure using stacked wafers, a via is created, and then filled with a metal to electronically couple the metal contacts located on the different layers. In other examples, the different layers of the memory can be electronically coupled using wires that couple to the metal BLs 130 or some other element within each of the layers.

Based on the foregoing, it should be appreciated that technologies for creating metal BLs have been presented herein. The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the example examples and applications illustrated and described, and without departing from the true spirit and scope of the present invention, which is set forth in the following claims.

What is claimed is:

1. A method comprising:

providing a wafer having a back side and a top side opposite the back side, the wafer comprising storage elements coupled to one or more transistors, the one or more transistors coupled to buried lines, the storage elements closer to the top side than the back side of the wafer; and exposing the buried lines from the back side of the wafer.

2. The method of claim 1, wherein exposing the buried lines from the back side of the wafer comprises polishing the back side of the wafer.

3. The method of claim 2, wherein the wafer is attached to a handle wafer prior to polishing.

4. The method of claim 1, further comprising modifying or replacing at least a portion of the buried lines to form buried conductive lines (BCLs) that have a conductivity higher than the buried lines.

5. The method of claim 4, further comprising configuring the BCLs, transistors and storage elements to operate as a memory array.

6. The method of claim 4, wherein the buried lines comprise silicon, and wherein modifying or replacing comprises reacting the silicon with a metal to form a silicide region.

7. The method of claim 4, wherein the buried lines comprise silicon, and wherein modifying or replacing comprises removing a portion of the silicon and replacing it with a conductive material.

8. The method of claim 7, wherein the conductive material comprises a barrier layer contacting the silicon and a metal or alloy contacting the barrier layer.

9. The method of claim 7, wherein the conductive material comprises a silicide contacting the silicon and a metal or alloy contacting the silicide.

10. The method of claim 4, wherein the buried lines comprise silicon, and wherein the silicon is replaced with a conductive material.

11. The method of claim 4, wherein the buried lines comprise silicon, and wherein modifying or replacing comprises epitaxially growing in-situ doped silicon.

12. The method of claim 4, wherein forming the BCLs comprises forming a first buried conductive line (BCL) that is substantially parallel to a second BCL, and wherein the first BCL is isolated from the second BCL by an isolation region.

13. The method of claim 12, further comprising replacing a portion of the isolation region with a low-k dielectric region.

14. The method of claim 4, wherein modifying or replacing further comprises:

etching a portion of each of the buried lines; and using a damascene process to add a conductive material in regions where the buried lines were etched.

15. The method of claim 14, wherein the conductive material comprises copper, tungsten, or aluminum.

16. The method of claim 1, wherein the wafer is a first wafer and the method further comprises coupling, electronically and mechanically, a second wafer comprising storage elements to the first wafer to form a three-dimensional memory structure.

17. The method of claim 1, wherein the wafer is attached to a handle wafer prior to exposing the buried lines.

18. The method of claim 1, further comprising:

creating isolation regions, wherein a first buried line and a second buried line are formed adjacent opposite sides of an individual one of the isolation regions.

19. The method of claim 18, wherein at least a portion of the isolation regions are replaced with a low-k dielectric.

20. The method of claim 19, further comprising etching the at least the portion of the isolation regions before the isolation regions are filled with a different low-k dielectric.

* * * * *